United States Patent
Hayashi et al.

(10) Patent No.: US 8,222,647 B2
(45) Date of Patent: Jul. 17, 2012

(54) METHOD FOR MAKING SEMICONDUCTOR APPARATUS AND SEMICONDUCTOR APPARATUS OBTAINED BY THE METHOD, METHOD FOR MAKING THIN FILM TRANSISTOR SUBSTRATE AND THIN FILM TRANSISTOR SUBSTRATE OBTAINED BY THE METHOD, AND METHOD FOR MAKING DISPLAY APPARATUS AND DISPLAY APPARATUS OBTAINED BY THE METHOD

(75) Inventors: Naoki Hayashi, Kanagawa (JP); Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/094,381

(22) Filed: Apr. 26, 2011

(65) Prior Publication Data

US 2011/0198600 A1 Aug. 18, 2011

Related U.S. Application Data

(62) Division of application No. 12/121,398, filed on May 15, 2008, now Pat. No. 7,955,916.

(30) Foreign Application Priority Data

May 18, 2007 (JP) .................. 2007-132784

(51) Int. Cl.
*H01L 29/786* (2006.01)

(52) U.S. Cl. ............. 257/66; 257/75; 257/E29.273; 257/E29.294

(58) Field of Classification Search .......... 257/66, 257/75, E29.273, E29.294
See application file for complete search history.

(56) References Cited

U.S. PATENT DOCUMENTS

| | | | |
|---|---|---|---|
| 5,427,962 A | 6/1995 | Sasaki et al. | |
| 5,612,235 A | 3/1997 | Wu et al. | |
| 5,670,400 A | 9/1997 | Lee et al. | |
| 6,043,512 A * | 3/2000 | Adachi | 257/66 |
| 6,294,441 B1 | 9/2001 | Yamazaki | |
| 6,380,011 B1 | 4/2002 | Yamazaki et al. | |
| 6,426,245 B1 | 7/2002 | Kawasaki et al. | |
| 6,605,496 B1 | 8/2003 | Yamazaki | |
| 6,649,218 B2 | 11/2003 | Qian | |
| 6,838,324 B2 | 1/2005 | Yamazaki et al. | |
| 6,953,731 B2 | 10/2005 | Shinriki et al. | |
| 7,101,740 B2 * | 9/2006 | Young | 438/158 |
| 7,208,787 B2 | 4/2007 | Manabe | |
| 7,309,616 B2 | 12/2007 | Nagashima et al. | |
| 7,323,368 B2 * | 1/2008 | Takayama et al. | 438/149 |
| 7,332,382 B2 | 2/2008 | Han | |
| 2003/0011022 A1 | 1/2003 | Manabe | |
| 2005/0233558 A1 | 10/2005 | Yamamoto et al. | |
| 2006/0079042 A1 | 4/2006 | Han | |
| 2006/0088961 A1 | 4/2006 | Jung et al. | |
| 2007/0069401 A1 | 3/2007 | Kakehata | |

(Continued)

FOREIGN PATENT DOCUMENTS

JP 2814319 8/1998

(Continued)

*Primary Examiner* — Mary Wilczewski
(74) *Attorney, Agent, or Firm* — SNR Denton US LLP

(57) ABSTRACT

A semiconductor apparatus having a substrate and a laminate structure formed on the substrate, the laminate structure including an insulating film made of a metal oxide and a semiconductor thin film, both the insulating film and the semiconductor thin film being crystallized.

6 Claims, 9 Drawing Sheets

U.S. PATENT DOCUMENTS

| | | |
|---|---|---|
| 2008/0105876 A1 | 5/2008 | Han |
| 2008/0124850 A1 | 5/2008 | Takayama et al. |
| 2008/0283842 A1 | 11/2008 | Hayashi et al. |
| 2009/0061613 A1 | 3/2009 | Choi et al. |
| 2009/0280600 A1 | 11/2009 | Hosono et al. |

FOREIGN PATENT DOCUMENTS

| | | |
|---|---|---|
| JP | 2002-057155 | 2/2002 |
| JP | 2008-288424 | * 11/2008 |
| KR | 2008056955 | * 6/2008 |

* cited by examiner

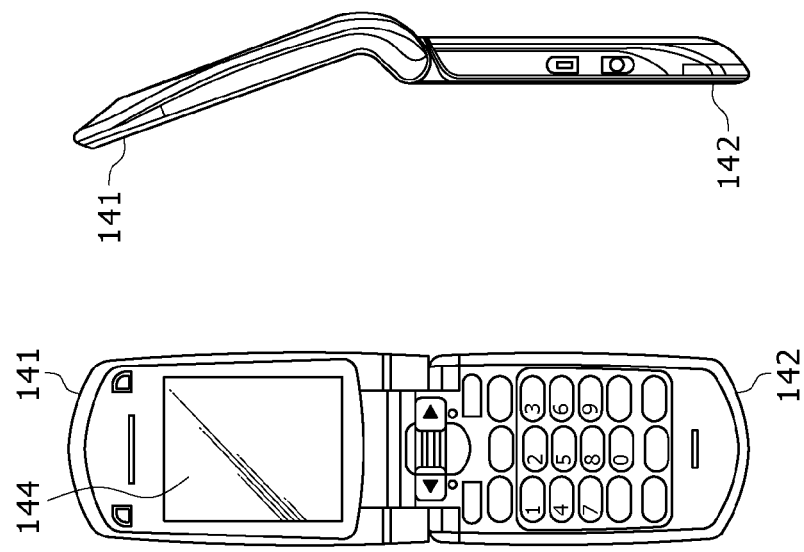
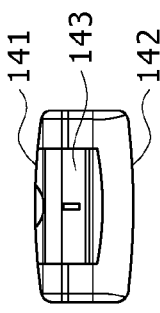
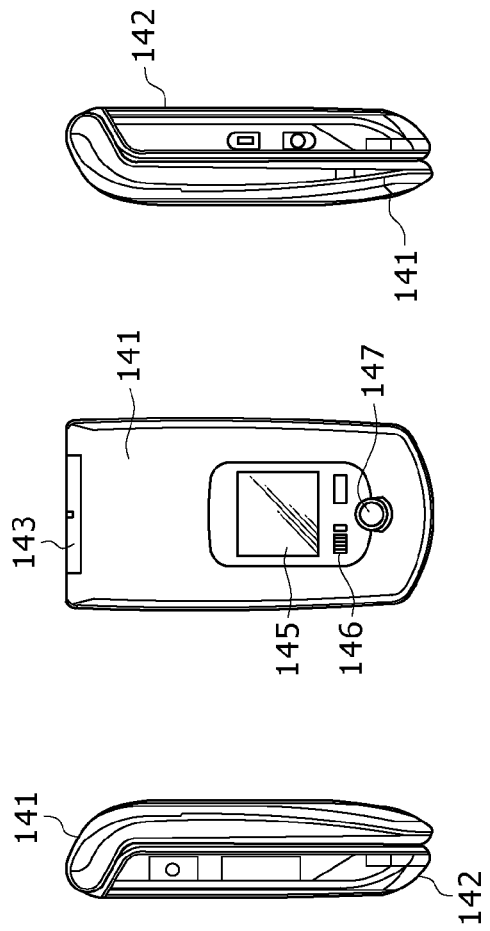
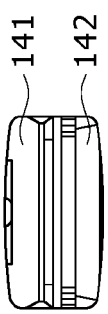

METHOD FOR MAKING SEMICONDUCTOR APPARATUS AND SEMICONDUCTOR APPARATUS OBTAINED BY THE METHOD, METHOD FOR MAKING THIN FILM TRANSISTOR SUBSTRATE AND THIN FILM TRANSISTOR SUBSTRATE OBTAINED BY THE METHOD, AND METHOD FOR MAKING DISPLAY APPARATUS AND DISPLAY APPARATUS OBTAINED BY THE METHOD

RELATED APPLICATION DATA

This application is a division of U.S. patent application Ser. No. 12/121,398, filed May 15, 2008, the entirety of which is incorporated herein by reference to the extent permitted by law. The present application claims priority to Japanese Patent Application No. JP 2007-132784 filed with the Japan Patent Office on May 18, 2007, the entirety of which also is incorporated by reference herein to the extent permitted by law.

BACKGROUND OF THE INVENTION

This invention relates to a method for making a semiconductor apparatus including the step of crystallizing an insulating film made of a metal oxide and also to a method for making a thin film semiconductor substrate and a method for making a display apparatus, both using the semiconductor apparatus. The invention also relates to a semiconductor apparatus, a thin film transistor substrate and a display apparatus obtained by the methods mentioned above, respectively.

In recent years, next generation displays have been extensively developed in the field of display apparatus, in which there is a demand for space-saving, high luminance, low consumption power and the like. For such display apparatus, attention has been drawn to organic EL (electroluminescence) displays using organic electroluminescent devices. This organic EL display has features in that a view angle thereof is wide because of the use of an organic electroluminescent device that is of a self-emitting type and power saving can be expected due to the unnecessity of backlight and that its response is high and the display can be made thin. Moreover, because a plastic substrate is used as a substrate for the purpose of making use of flexibility inherent to an organic electroluminescent device, attention has also been paid thereto as a apparatus having flexibility.

Among drive systems for the organic EL display, an active matrix system using a drive device of thin film transistors (TFT) is superior to conventional passive matrix systems with respect to response time and resolution. Thus, it has been accepted that the active matrix system is particularly suited for organic EL displays having such features as set out above.

The organic EL display of the active matrix type has an organic electroluminescent device having at least organic luminescent material and a drive substrate provided with a drive device (thin film transistor) driving the luminescent device. The organic EL display is so arranged that the drive substrate is bonded with a seal substrate so as to sandwich the organic electroluminescent device therebetween through a bonding layer.

The organic EL display of the active matrix type essentially includes, at least, a switching transistor controlling pixel contrast and a drive transistor controlling luminescence of the organic electroluminescent device. A gate electrode of the drive transistor is connected with a retention capacitor for retaining a charge in response to a response signal.

It is known that with a thin film transistor, when a voltage is continuedly applied to a gate electrode thereof, a threshold voltage is shifted. Moreover, the thin film transistor of the organic EL display is liable to cause the threshold shift because it is necessary to keep the state of current passage so far as the organic EL device is subjected to luminescence emission. If the threshold voltage of the drive transistor is shifted, an amount of current passing through the drive transistor varies, with the result that the luminescent elements constituting individual pixels change in luminance.

In recent years, in order to mitigate the threshold shift of this thin film transistor, there has been developed an organic EL display using a thin film transistor wherein the channel region is formed of a semiconductor layer of polysilicon (p-Si). However, in the polysilicon process, crystal grains existing in the channel are non-uniform in size, with the likelihood that transistor characteristics vary. Eventually, there arises a problem in that the emission luminance of the organic EL display differs on a pixel to pixel basis.

In order to suppress the variation of the transistor characteristics, there has been used a technique wherein silicon is finely crystallized to such an extent that crystal grains do not become non-uniform in size. Moreover there has also been used a technique wherein an amorphous silicon layer is formed on a polysilicon layer so as to suppress the variation (see, for example, Japanese Patent No. 2814319).

In this connection, however, the finely crystallized silicon layer is smaller in carrier mobility that a polysilicon layer. In order to obtain the same amount of luminescence or on current, a drive transistor used to control the luminescence of an organic electroluminescent device requires a high voltage, thus resulting in an increase in consumption power.

Magnitude Id of an on current passing through the formation of a channel in the drive transistor is expressed according to the following equation (1)

$$Id=(1/2)\mu(W/L)Cox(Vg-Vth)^2 \quad (1)$$

In the equation (1), μ represents a carrier mobility in a reversed layer converted to a channel, W represents a gate width of the transistor, L is a gate length of the transistor, Cox represents a capacitance of a gate insulating film, Vg is a gate voltage, and Vth represents a threshold voltage.

According to the above equation (1), it will be seen that in order to obtain the same on current, it is important to increase the carrier mobility μ, gate width W, capacitance Cox of the gate insulating film or voltage difference (Vg−Vth), or to reduce the gate length L.

In order to increase capacitance Cox of the gate insulating film, it is necessary to increase a specific permittivity of the gate insulating film or decrease a physical film thickness of the insulating film. However, in view of the fact that the gate insulating film has a problem on leak current, a difficulty is involved in decreasing the film thickness. For increasing the specific permittivity of the gate insulating film, it is necessary to use a material having high permittivity. As a material whose specific permittivity is high, mention is made, for example, of metal oxides such as tantalum pentaoxide. Metal oxides such as tantalum pentaoxide, titanium oxide and the like exhibit a specific permittivity as high as about several times to about 100 times a silicon oxide ($SiO_x$) film or a silicon nitride ($SiN_x$) film as a hitherto employed gate insulating film. Thus, the use of these metal oxides as a gate insulating film enables the capacitance Cox of gate insulating film to be increased.

In general, metal oxides such as tantalum pentaoxide, titanium oxide and the like are formed as a film in an amorphous state according to a plasma CVD (chemical vapor deposition)

method or a sputtering method. However, if tantalum pentaoxide or titanium oxide is in an amorphous state, leak pass is involved, for which when a leak current increases, a current runs at the off time. To cope with this, Japanese Laid-Open No. 2002-57155 proposes a method of improving a leak current, in which after formation of a film made of tantalum pentaoxide or titanium oxide, the film is crystallized by thermal treatment in an non-oxidative gas at a temperature of not lower than 700° C.

SUMMARY OF THE INVENTION

Such a thermal treatment at a temperature of 700° C. or over as set out above is effective against a metal oxide formed on a substrate made of a semiconductive material such as silicon. However, if this thermal treatment is effected on a metal oxide formed on a glass substrate or plastic substrate used for an organic EL display, cracks or strains are inevitably caused.

Accordingly, it is desirable to provide a method for making a semiconductor apparatus which enables an insulating film of a metal oxide to be crystallized by a low temperature process whereby a device ensuring improved characteristics is formed on a glass substrate or plastic substrate.

It is further desirable to provide a semiconductor apparatus obtained by the above method, and also methods for making a thin film transistor substrate and a display apparatus, both using the semiconductor apparatus mentioned above and such a thin film transistor substrate and display apparatus as mentioned above. In order to achieve the above needs, there is provided a method for making a semiconductor device according to the embodiment, which is carried out in the following way. Initially, a laminated body or structure of an insulating film made of a metal oxide and a semiconductor thin film is formed on a substrate. Next, a light absorption layer is formed on top of the laminated structure. Thereafter, an energy beam of a wavelength capable of being absorbed by the light absorption layer is irradiated on the light absorption layer to crystallize the insulating film and the semiconductor thin film simultaneously by application of heat generated in the light absorption layer.

The embodiment also relates to a semiconductor apparatus obtained by the method set out above, which includes a laminated body or structure including a semiconductor thin film and an insulating film made of a metal oxide, characterized in that the insulating film and the semiconductor thin film are both crystallized.

Further, the embodiment is also directed to a method for making a thin film transistor substrate, to which the first-mentioned method is applied, and also to such a thin film transistor substrate as obtained by the method, in which a gate insulating film is constituted by use of an insulating film made of a metal oxide.

Additionally, the embodiment relates to a method for making a display apparatus by application of the first-mentioned method and a display apparatus obtained by this method, in which pixel electrodes are connected to thin film transistors wherein a gate insulating film is constituted by use of an insulating film made of a metal oxide.

According to the method for making a transistor apparatus stated above, irradiation of an energy beam through the light absorption layer enables the semiconductor thin film to be crystallized by heat generation of the light absorption layer simultaneously with the crystallization of the insulating film (gate insulating film) made of a metal oxide provided as a lower layer. Thus, the insulating film using a metal oxide can be crystallized by application of a low temperature process upon crystallization of the semiconductor thin film without resorting to a thermal treatment, thereby obtaining an insulating film whose leak current is reduced.

As stated above, according to the embodiment, when the semiconductor thin film is crystallized, such a low temperature process as set out above can be applied for the crystallization of the insulating film made of a metal oxide. As a result, it becomes possible to form an insulating film, made of a crystallized metal oxide and reduced in leak current, on a glass substrate or plastic substrate. In this way, a semiconductor device having a laminated structure of a semiconductor thin film and an insulating film can be improved in characteristics.

BRIEF DESCRIPTION OF THE DRAWINGS

FIGS. 10A to 10G are, respectively, a schematic view showing a mobile terminal, e.g. a cell phone, wherein FIG. 10A is a plan view of the terminal in an open state, FIG. 10B is a side view, FIG. 10C is a plan view in a closed state, FIG. 10D is a left side view, FIG. 10-E is a right side view, FIG. 10F is a top view and FIG. 10G is a bottom view.

DETAILED DESCRIPTION OF THE PREFERRED EMBODIMENTS

Embodiments of the invention, starting from a device-making method, are described in detail with reference to the accompanying drawings.

<Semiconductor Device and Thin Film Transistor Substrate>

FIGS. 1A to 1D and 2A to 2D are, respectively, sectional views showing the steps of a method for making a semiconductor device according to the embodiment wherein the method is applied to the fabrication of a thin film transistor. In this embodiment, a procedure of making a thin film transistor substrate provided with a thin film transistor is illustrated based on these figures.

Figure 1A:
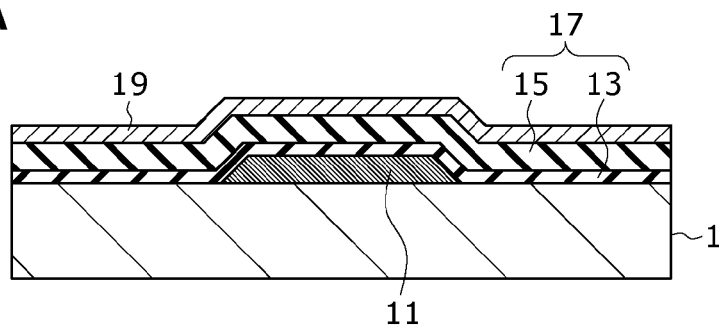
FIGS. 1A to 1D are, respectively, a schematic sectional view illustrating a step of a method for making a semiconductor apparatus according to an embodiment of the invention.

Initially, as shown in FIG. 1A, an insulating substrate 1 is provided. A glass substrate or plastic substrate is used as the substrate 1. As a matter of course, any substrates of a type wherein electric insulation on a surface side is ensured may also be used and include, for example, a semiconductor substrate on which an insulating layer is formed.

Next, a pattern of a gate electrode 11 is formed on the substrate 1. This gate electrode 11 is formed of a material whose electric conductivity is good, e.g. molybdenum (Mo).

Thereafter, a gate insulating film 17 formed by laminating a silicon nitride ($SiN_x$) film 13 and a metal oxide film 15 in this order is formed according to a sputtering or CVD method so as to cover the gate electrode 11 therewith.

The silicon nitride film 13 is provided as a barrier layer so as to prevent a contaminant from the substrate 1 side from being diffused into an upper layer. Instead of the silicon nitride film 13, there may be used a silicon-based film such as a silicon oxide ($SiO_x$) film, silicon oxide nitride ($SiON_x$) film or the like, or a combination thereof.

The metal oxide film 15 is made of an oxide of one of metal elements of zirconium (Zr), hafnium (Hf), tantalum (Ta), scandium (Sc), yttrium (Y), lanthanum (La), cerium (Ce), praseodymium (Pr), neodymium (Nd), samarium (Sm), Europium (Eu), gadolinium (Gd), terbium (Tb), dysprosium (Dy), holmium (Ho), erbium (Er), ytterbium (Yb), lutetium (Lu), strontium (Sr), aluminium (Al), titanium (Ti), niobium (Nb), tungsten (W) and bismuth (Bi), or a composite oxide of two or more of the metal elements. Alternatively, perovskite oxides such as $PbTiO_3$, (Pb, La) (Zr, Ti) $O_3$ (PLZT), $SrBiTaO_9$, (SBT), $SrTiO_3$ (STO), (Ba, Sr) $TiO_3$ (BSTO), and the like may also be used. For one instance, a metal oxide film 15 made of titanium oxide ($TiO_x$) is formed herein.

This metal oxide film 15 may be deposited and formed as a film, for example, by a sputtering or CVD method. In general, the film is formed by a MOCVD method (metalorganic chemical vapor deposition) (see Japanese Patent Laid-Open No. 2005-23065). In the MOCVD method, the film formation is carried out at a temperature at which the substrate 1 suffers no cracking or strain (e.g. 500° C. or below). In such a MOCVD method, a metal complex such as, for example, a β-diketone complex or the like is vaporized and mixed with a gas containing oxygen and is heated to provide a metal oxide film. The metal complex should preferably be one that is vaporized at a temperature as low as possible. The thus formed metal oxide film is amorphous in nature.

The gate insulating film 17 having such a laminated structure preferably has a thickness of 50 to 700 nm in total when taking the balance of a leak current and capacitance into consideration. For example, the silicon nitride film 13 is formed herein in a thickness of 100 nm and the metal oxide film 15 is formed in a thickness of 300 nm.

It will be noted that although the gate insulating film 17 is formed as a double-layered structure including the silicon nitride film 13 and the metal oxide film 15, the gate insulating film 17 may be constituted of the metal oxide film 15 alone if no consideration is necessary for the diffusion of a contaminant from the substrate 1 side. Moreover, the metal oxide film 15 may be formed by laminating films of plural types of metal oxides. In addition, the gate insulating film 17 may have such a structure that a silicon-based insulating film, such as of $SiO_x$, $SiN_x$, $SiON_x$ or the like, is provided between the metal oxide films 15, or may have such a structure that the metal oxide film 15 is laminated between silicon-based insulating films such as of $SiO_x$, $SiN_x$, $SiON_x$ or the like.

Thereafter, an amorphous silicon film 19 serving as a semiconductor thin film is deposited and formed as laminated on the amorphous metal oxide film 15 by a CVD or sputtering method. This amorphous silicon film 19 is generally formed in a thickness of 10 to 50 nm and is formed herein in a thickness, for example, of 30 nm.

Figure 1B:
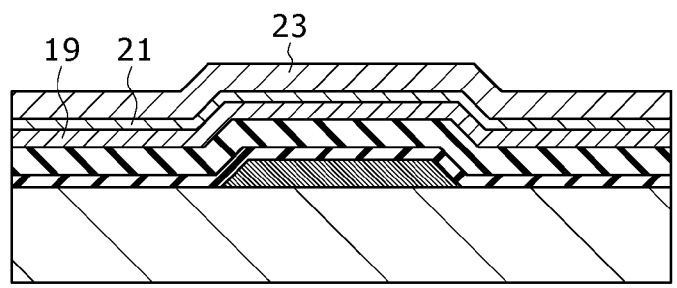

Next, as shown in FIG. 1B, a light absorption layer 23 is formed over the amorphous silicon film 19 via a buffer layer 21.

The buffer layer 21 is formed not only to mainly prevent a metal material used for the light absorption layer 23 from being diffused into the amorphous silicon film 19 side, but also to prevent thermal reaction between the metal material and the silicon. Such a buffer layer 21 is formed, for example, of silicon oxide and preferably has a thickness of 5 to 50 nm and is formed in a thickness of 30 nm herein.

The light absorption layer 23 may be made of a material that is able to absorb an energy beam for conversion to heat when irradiated with the energy beam in a subsequent stage. For such a light absorption layer 23, there is used, for example, a metal material such as molybdenum (Mo), tungsten (W), cobalt (Co), chromium (Cr), titanium (Ti), tantalum (Ta) or the like, or a silicide such as WSi, MoSi, TiSi, TaSi, CoSi or the like. The light absorption layer 23 is formed, for example, of molybdenum (Mo) herein. The light absorption layer 23 preferably has a thickness of 50 to 300 nm and is formed herein in a thickness of 200 nm.

The buffer layer 21 and light absorption layer 23 stated above are deposited by a CVD or sputtering method.

Figure 1C:
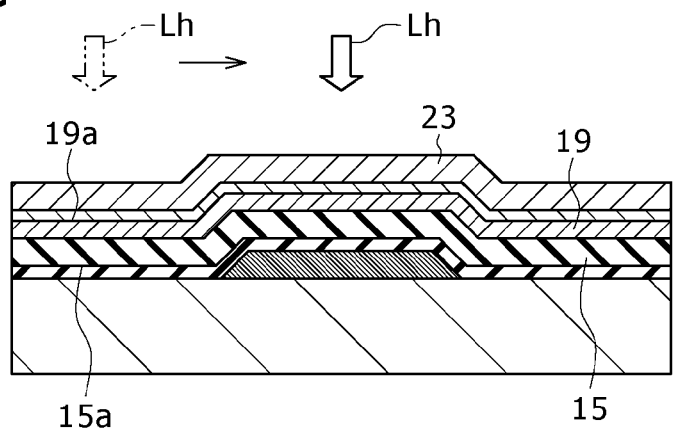

Next, as shown in FIG. 1C, energy beam Lh is irradiated on the light absorption layer 23. Energy beam Lh of a wavelength capable of being absorbed in the light absorption layer 23 is irradiated thereon. In this way, an annealing treatment is carried out wherein the energy beam Lh is optically absorbed by the light absorption layer 23 to cause heat generation. This annealing treatment enables the amorphous silicon film 19 to be crystallized, thereby providing a fine crystalline silicon film 19a. The heat generated in the light absorption layer 23 is diffused not only to the amorphous silicon film 19, but also to the lower metal oxide film 15, so that the metal oxide film 15 is simultaneously crystallized to provide a crystalline metal oxide film 15a.

Such an energy beam Lh as set out above includes, for example, a laser beam from a solid laser. The energy beam Lh is scan-irradiated only on a necessary portion. In this case, scan irradiation of the energy beam Lh is carried out partly on a peripheral area including the above of the gate electrode 11. The scan irradiation with a solid laser and further partial irradiation ensure thermal diffusion within a short time, thereby preventing the substrate 1 from distortion.

The laser beam is not limited to those from solid lasers, but may be ones that enable thermal diffusion through the light absorption layer 23. In this connection, however, if a wavelength that cannot be directly absorbed by the light absorption layer 23 is used, no thermal diffusion to the lower metal oxide film 15 occurs. In this sense, it is important to use a wavelength capable of being absorbed by the light absorption layer 23. The energy beam is irradiated to such an extent that thermal diffusion extends over the gate electrode 11, thereby permitting crystallinity of the metal oxide film 15 and the amorphous silicon film 19 at portions thereof over the gate electrode and neighborhoods thereof to become higher than at the other portions.

Figure 1D:
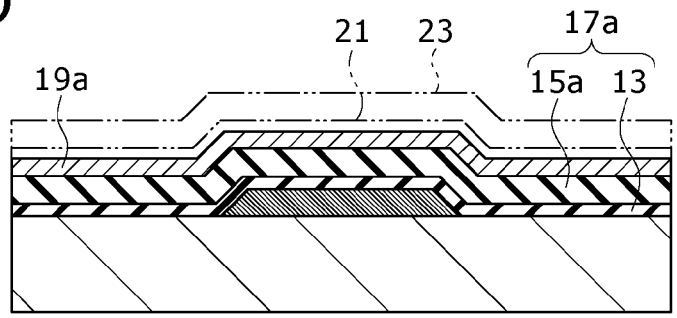

As stated hereinabove, as shown in FIG. 1D, the amorphous silicon film (19) is converted to a fine crystalline silicon film 19a and the amorphous metal oxide film (15) is converted to a crystalline metal oxide film 15a at a necessary portion thereof, respectively. A gate insulating film 17a constituted of the crystalline metal oxide film 15a and the silicon nitride film 13 is provided. Thereafter, the light absorption layer 23 and the buffer layer 21 are removed by etching. It will be noted that where a silicon-based insulating film such as of $SiN_x$, $SiO_x$, SiON or the like is used as the buffer layer 21, the buffer layer 21 may not be removed and used, as it is, as part of an etching stop layer set out hereinbelow.

Figure 2A:
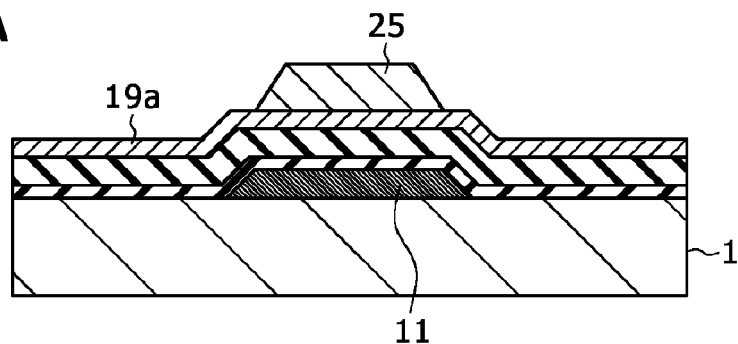
FIGS. 2A to 2D are, respectively, a schematic sectional view illustrating a step of the method subsequent to FIG. 1D.

Next, as shown in FIG. 2A, an etching stop layer 25 is formed on the fine crystalline silicon layer 19a as superposed with the gate electrode 11. The etching stop layer 25 is formed by use of a silicon-based insulating film such as of $SiN_x$, $SiO_x$, SiON or the like, and the insulating film is pattern-etched by use, as a mask, of a resist pattern formed by backside exposure. Such an etching stop layer 25 preferably has a thickness of about 50 to 500 nm.

Figure 2B:
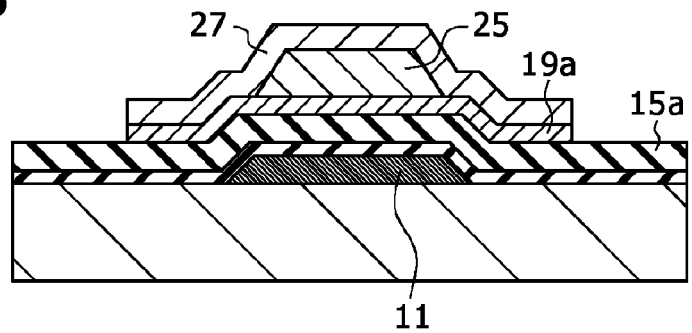

Subsequently, as shown in FIG. 2B, an $n^+$ amorphous silicon film 27 is formed over the substrate 1 to cover the etching stop layer 25 according to a CVD method or the like. This $n^+$ amorphous silicon film 27 preferably has a thickness of 10 to 300 nm and is formed herein in a thickness of 100 nm. Next, according to etching using a resist pattern, not shown, as a mask, the $n^+$ amorphous silicon film 27 and lower fine crystalline silicon film 19a are subjected to patterning in the form of an active region covering the gate electrode 11 and extending to opposite sides thereof, respectively. The resist pattern is removed after the etching. It will be noted that a portion of the fine crystalline silicon film 19a laminated on the gate electrode 11 establishes a channel region.

Figure 2C:
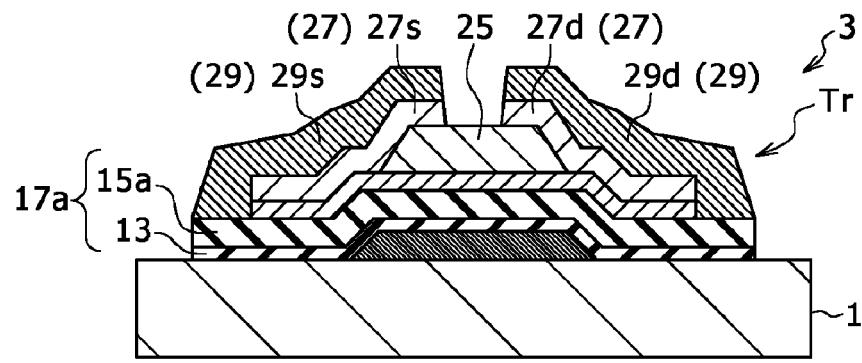

Thereafter, as shown in FIG. 2C, a metal layer 29 made of aluminium (Al), titanium (Ti) or a laminate thereof is formed by a sputtering method or the like. Next, according to etching using a resist pattern, not shown, as a mask, the metal layer 29 and the $n^+$ amorphous silicon film 27 are so patterned as to be isolated from each other above the gate electrode 11, and the metal layer 29 is formed in a wiring pattern. In this way, a source electrode 29s and a drain electrode 29d, each made of the metal layer 29, are formed, and a source 27s and a drain 27d, each made of the $n^+$ amorphous silicon film 27, are formed, respectively.

As stated hereinabove, a thin film transistor Tr of a bottom gate type using the crystallized metal oxide film 15a as the gate electrode 17a is obtained. This thin film transistor Tr includes a laminated structure of the crystallized metal oxide film 15a and the fine crystalline silicon film 19a.

Figure 2D:
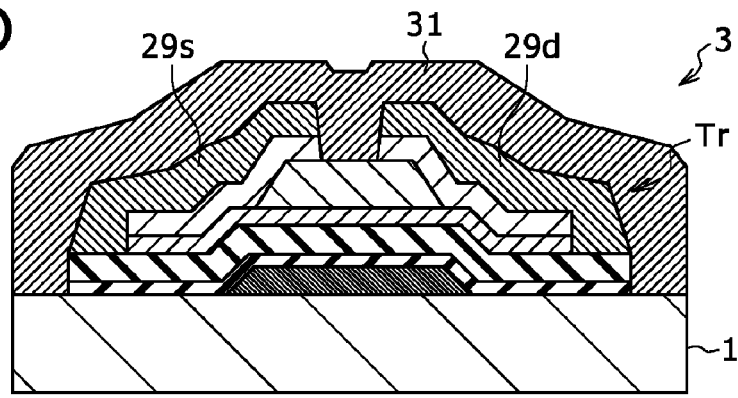

Subsequently, as shown in FIG. 2D, a passivation film 31 made, for example, of silicon nitride is formed entirely over the substrate 1 by a CVD method or the like so as to cover the source electrode 29s and the drain electrode 29d therewith. According to the procedure stated above, a TFT substrate 3 wherein the bottom gate type of thin film transistor Tr is formed on the substrate 1 is obtained.

<Display Device>

Figure 3:
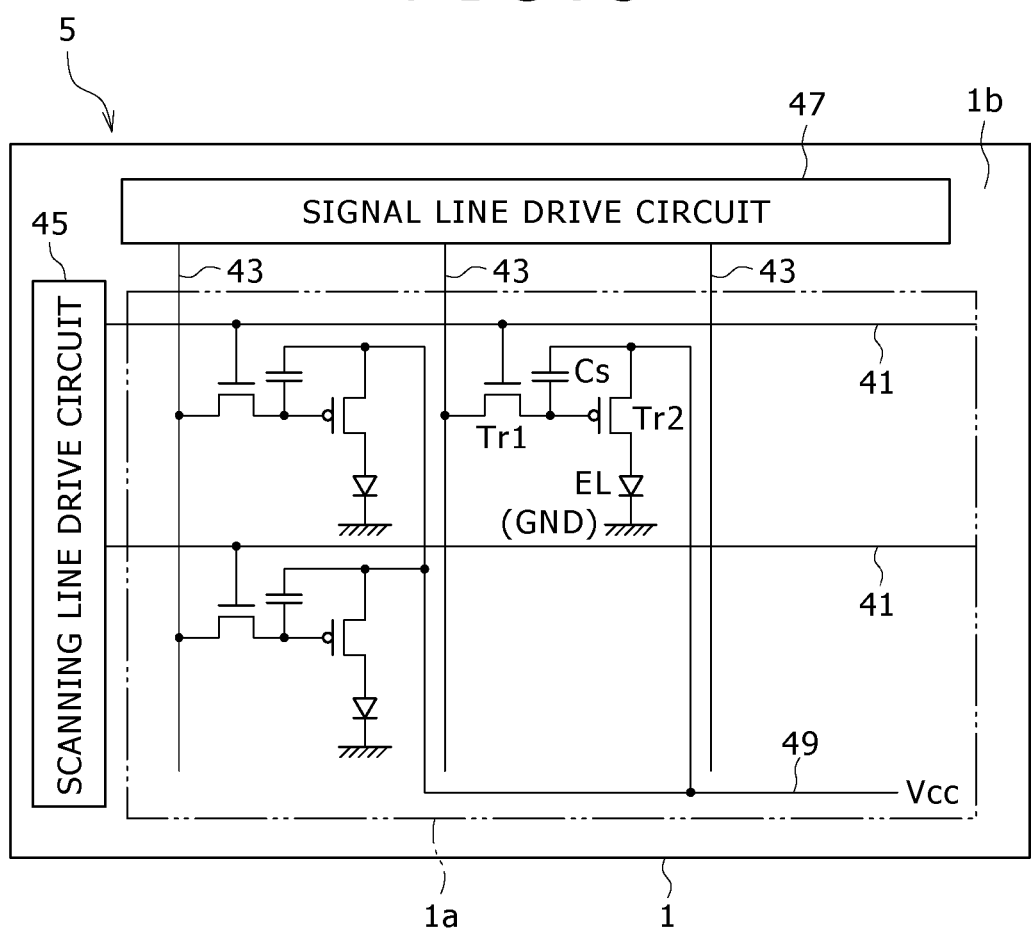
FIG. 3 is a schematic plan view showing an example of a panel arrangement of a display apparatus.

FIG. 3 is a schematic view showing a panel arrangement illustrating an example of an organic EL display device as an instance of a display device 5 using the thin film transistor substrate made in a manner as stated above.

As shown in the figure, a display region 1a and a peripheral region 1b are set on the substrate 1 of the display device 5. The display region 1a is extensively arranged with a plurality of scanning lines 41 and a plurality of signal lines 43, and a pixel array unit is provided wherein one pixel is provided correspondingly to an intersection between the lines 41 and 43. The peripheral region 1b is arranged with a scanning line drive circuit 45 for scanning and driving the scanning line 43 and a signal line drive circuit 47 supplying a picture signal (i.e. an input signal) corresponding to luminance information to the signal line 43.

A pixel circuit provided at each intersection between the scanning line 41 and the signal line 43 is constituted, for example, of a switching thin film transistor Tr1, a driving thin film transistor Tr2, a retention capacitor Cs and an organic electroluminescent element EL. When a scanning pulse is applied to the scanning line 41 by driving the scanning line drive circuit 45 and a required signal is fed to the signal line 43, the switching thin film transistor Tr1 is turned on. This enables a picture signal written from the signal line 43 to be retained in the retention capacitor Cs, and a current corresponding to the retained amount of signal is fed from the driving thin film transistor Tr2 to the organic luminescent element EL. The organic electroluminescent element EL generates luminescence at a luminance corresponding to the current value. It is to be noted that the driving thin film transistor Tr2 and the retention capacitor Cs are connected to a common power supply line (Vcc) 49.

In this arrangement, the switching thin film transistor Tr1 and the driving thin film transistor Tr2 are, respectively, fabricated according to such a procedure as stated hereinabove, and the retention capacitor Cs is also fabricated substantially in the same manner.

The arrangement of the pixel circuit is illustrated by way of example, and a capacitor element may be further provided in the pixel circuit, if necessary. In addition, the pixel circuit may be constituted by use of a plurality of transistors. Moreover, the peripheral region 1b may be additionally provided with a necessary drive circuit corresponding to an alteration in the pixel circuit.

Figure 4:
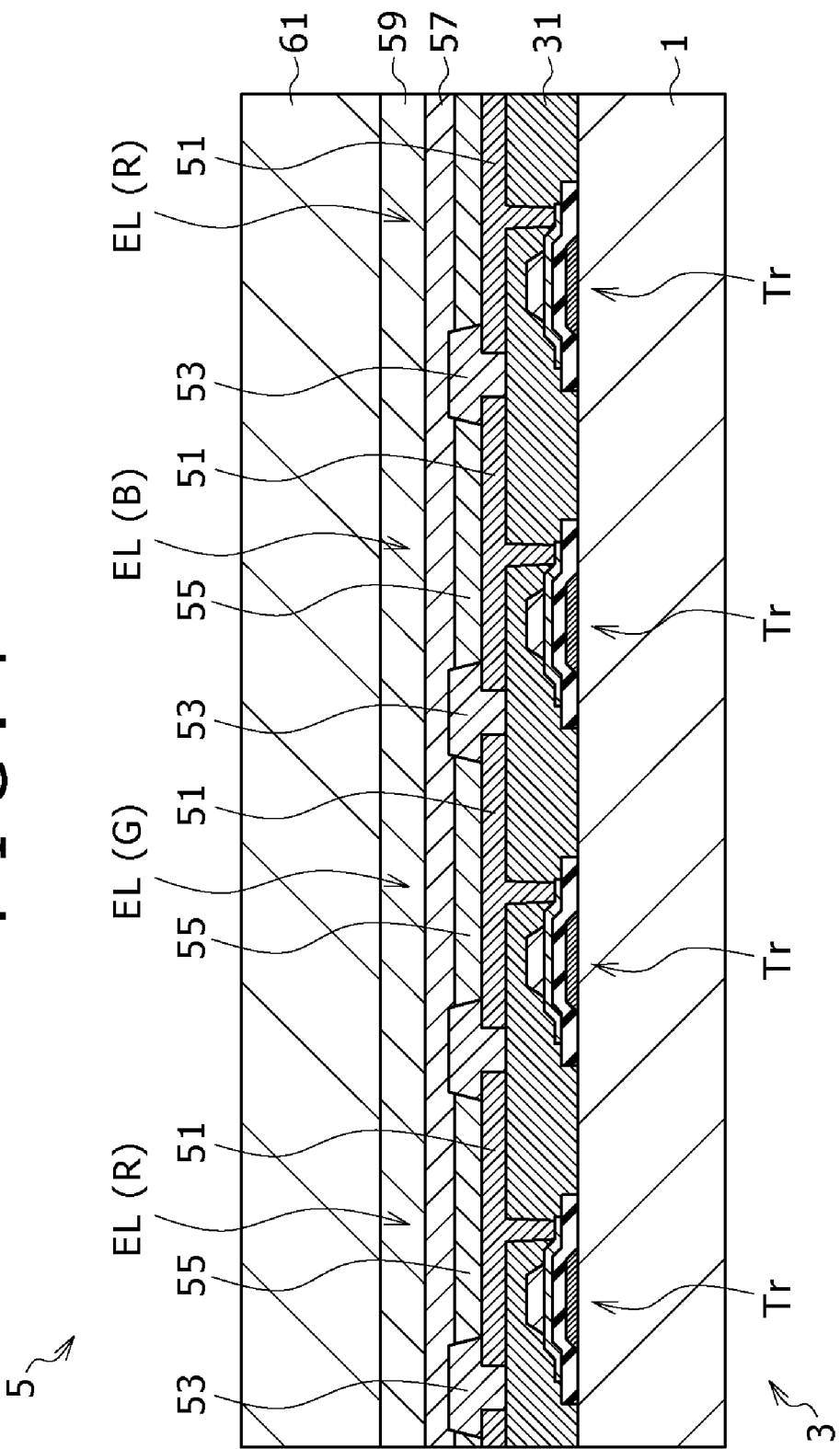
FIG. 4 is a schematic sectional view showing an example of a panel arrangement of a display apparatus, to which the embodiment is applied.

FIG. 4 is a schematic sectional view showing an essential part of four pixels of the display device 5. As shown in the figure, there is provided, as a drive substrate for each pixel, a TFT substrate 3 including a thin film transistor Tr (corresponding to the driving thin film transistor Tr2), a switching thin film transistor Tr1 (not shown) and a retention capacitor Cs (not shown), on which an organic electroluminescent element EL is provided via a flattened insulating film serving also as a passivation film 31. The respective organic electroluminescent devices EL are provided such that red light-emitting devices (R) emitting red light, green light-emitting devices (G) emitting green light and blue light-emitting devices (B) emitting blue light are successively formed in a matrix as a whole.

The respective electroluminescent devices EL are provided with a pixel electrode 51 connected to the thin film transistor Tr via a connection hole formed in the flattened insulating film 31. The respective pixel electrodes 51 are insulated and isolated from one another by means of an insulating film pattern 53 surrounding the peripheral edge of each pixel electrode. An organic layer 55 including an emission layer and a common electrode 57 for individual pixels are laminated on these pixel electrodes 51, and a portion wherein the organic layer 55 is sandwiched between two electrodes 51 and 57 functions as the organic electroluminescent element EL.

The pixel electrode 51 is constituted as an anode and has a function as a reflection layer, and is formed, for example, of a metal such as platinum (Pt), gold (Au), silver (Ag), chromium (Cr), aluminium (Al) or tungsten (W), or an alloy thereof.

On the other hand, the common electrode 57 is provided as a cathode and also as a translucent electrode having translucency against light generated in the organic layer 55. Such a common electrode 57 is constituted, for example, of an alloy of magnesium and silver. Since the common electrode 57 is translucent, the luminescence emitted at the organic layer (emission layer) 55 is resonated with the pixel electrode (reflection layer) 51, thereby causing multiple interference. Eventually, the half-value width of the spectra of light retrieved from the common electrode 57 side is reduced, thereby improving chromatic purity. External light incident from the common electrode 58 side can also be attenuated based on the multiple interference.

The organic layer 55 sandwiched between the electrodes 51 and 57 is appropriately controlled in thickness depending on the luminescent color of the respective organic electroluminescent elements so as to permit the emitted luminescence to be resonated as stated above. This organic layer 55 is arranged by laminating a hole transport layer, a luminescence layer and an electrode transport layer in the following order from the side of the pixel electrode 51 serving as an anode. The hole transport layer is to enhance a hole injection efficiency to the luminescence layer and the electron transport layer is to enhance an electron injection efficiency to the luminescence layer. Such an organic layer 55 is so arranged that when a voltage is applied between the electrode 51 and 57, re-combination of the electron and the hole effectively occurs within the luminescence layer, thereby generating luminescence.

The constituent materials of the hole transport layer include, for example, bis[(N-naphthyl)-N-phenyl]benzidine (α-NPD)

The constituent materials of the electron transport layer include, for example, 8-quinolinol aluminium complex ($Alq_3$).

The materials for the luminescence layer differ depending on the luminescent color. A red luminescent device EL (R) is constituted of a mixture of 8-quinolinol aluminium complex ($Alq_3$) and two times in volume of d-dicyanomethylene-6-(p-dimethylaminostyryl)-2-methyl-4H-pyran (DCM), With a green luminescent device EL (G), there is used, for example, 8-quinolinol aluminium complex ($Alq_3$). With a blue luminescent device EL (B), the device is constituted, for example, of bathocuproine.

The TFT substrate 3 wherein the organic electroluminescent devices EL are so arranged as stated above is bonded thereon with a seal substrate 61 via a bonding agent 59 while sandwiching the organic electroluminescent devices EL therebetween. The bonding agent 59 and the seal substrate 61 are, respectively, made of materials through which the luminescences from the respective organic electroluminescent devices EL pass.

Although not shown in the figure, the seal substrate 61 constituted, for example, of a transparent glass material or the like may be provided thereon with color filters such as a red filter, a green filter and a blue filter corresponding to the respective pixel units (i.e. arrangement positions of the organic electroluminescent devices EL). A black matrix is provided between pixels and around the peripheral edge of the display region where the pixels are arranged, with which luminescences from the respective organic electroluminescent devices EL are retrieved and external light reflected at the organic electroluminescent devices EL is absorbed thereby improving a contrast. These color filters and black matrix may be provided on whichever surface of the seal substrate and it is preferred to provide them at the TFT substrate 3 side. This permits the color filters and black matrix to be protected without exposure thereof to the surface.

The seal substrate 61 is cut away at portions necessary for exposing terminals taken out to a peripheral portion, for example, at the TFT substrate 3 side.

Figure 5:
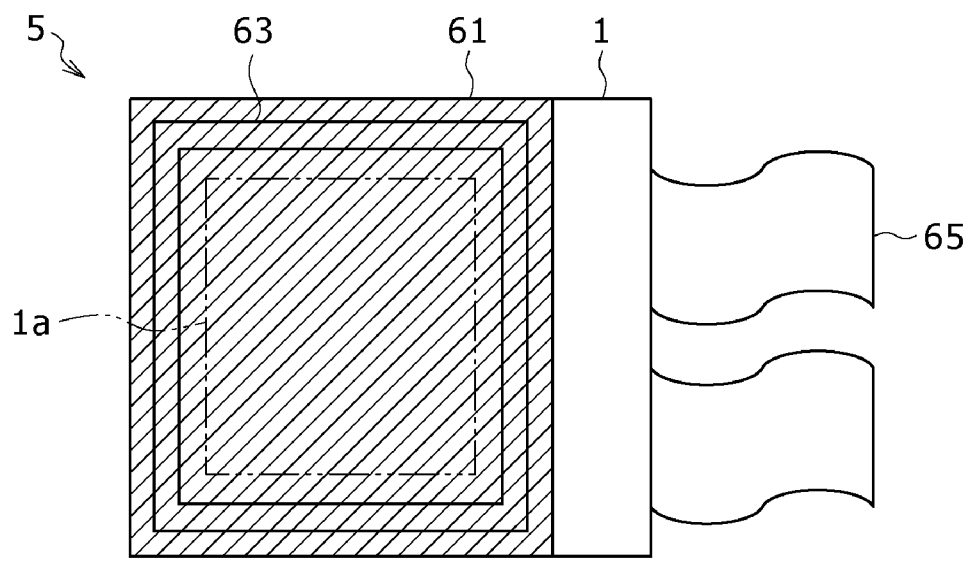
FIG. 5 is a schematic view showing a closed module-shaped display apparatus, to which the embodiment is applied.

It will be noted that the display device 5 according to the embodiment includes a module form of a sealed arrangement as shown in FIG. 5. Such a module is, for example, a display module wherein a sealing unit 63 surrounding a display region 1a of a display array unit is provided, followed by bonding to a counterpart (the above-mentioned seal substrate 61) such as of transparent glass by use of the sealing unit 63 as a bonding agent. The transparent seal substrate 61 may be provided with color filters, a protection film, a black matrix and the like as stated above. It is to be noted that the substrate 1 used as a display module formed with the display region 1a may be provided with a flexible printed board 65 for inputting and outputting signals or the like from outside to the display region 1a (pixel array unit).

APPLICATION EXAMPLE

The display apparatus of the embodiment illustrated hereinabove is applicable as a display apparatus of electronic equipment of all fields wherein picture signals inputted to an electronic equipment or produced in the electronic equipment is display as an image or picture. Such electronic equipment are as shown in FIGS. 6 to 10A-10G and include, for example, a digital camera, a notebook-sized personal computer, portable terminal devices such as a cell phone and the like, a video camera and the like. Examples of the electronic equipment to which the embodiment is applied are illustrated.

Figure 6:
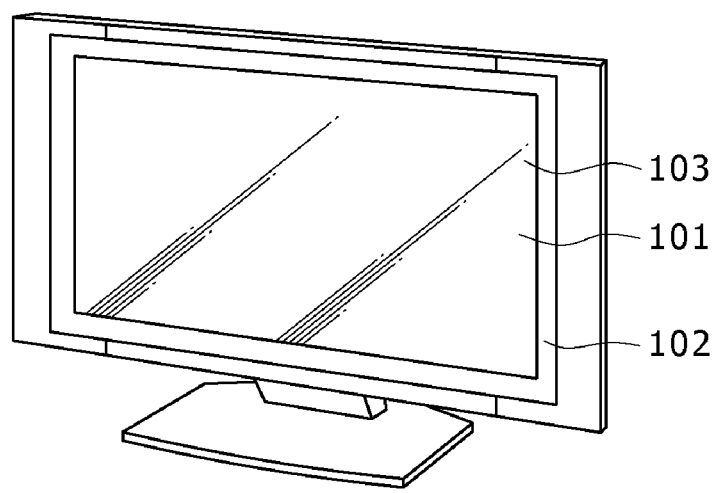
FIG. 6 is a schematic perspective view showing a television, to which the embodiment is applied.

FIG. 6 is a perspective view showing a television set, to which the embodiment is applied. The television set of this application example includes a picture display screen unit 101 made up of a front panel 102, a filter glass 103 and the like wherein the display apparatus of the embodiment is used as the picture display screen unit 101.

Figure 7A:
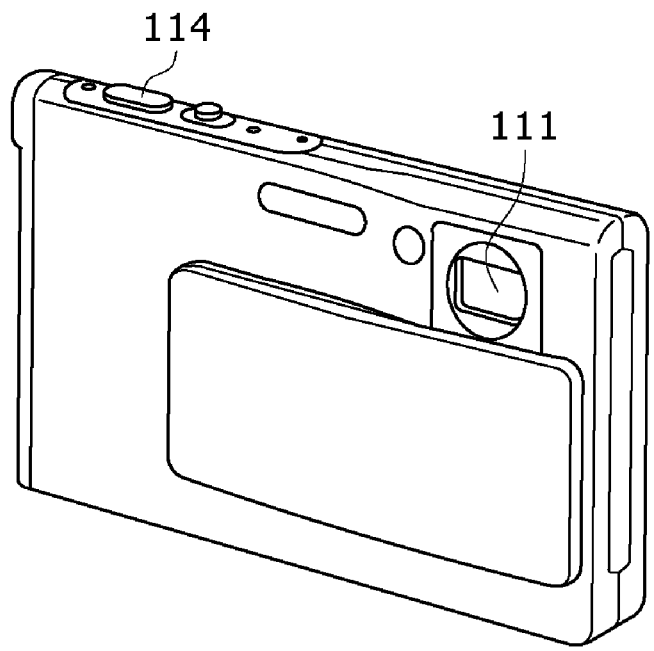
FIGS. 7A and 7B are, respectively, schematic perspective views of a digital camera, to which the embodiment is applied, as viewed from a front side and a back side thereof.
Figure 7B:
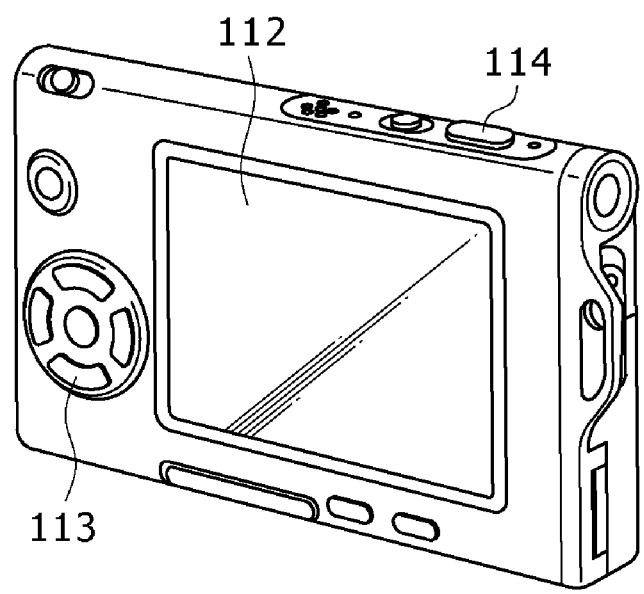

FIGS. 7A and 7B are, respectively, a schematic view showing a digital camera, to which the embodiment is applied. FIG. 7A is a perspective view as viewed from a front side and FIG. 7B is a perspective view as viewed from a back side. The digital camera of this application example includes a light emitting unit 111 for flashlight, a display unit 112, a menu switch 113 and a shutter button and the like, wherein the display apparatus of the embodiment is used as the display unit 112.

Figure 8:
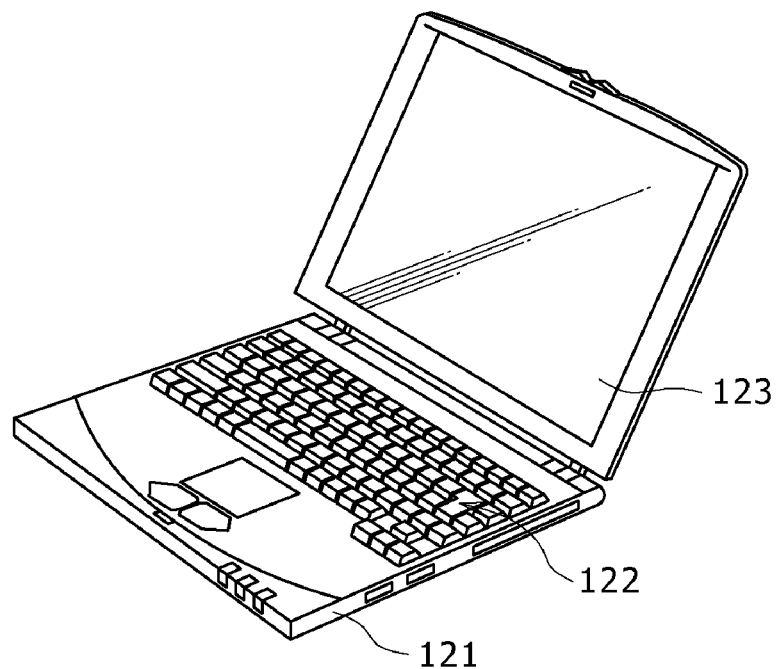
FIG. 8 is a schematic perspective view showing a laptop computer, to which the embodiment is applied.

FIG. 8 is a perspective view showing a notebook-type personal computer, to which the embodiment is applied. The notebook-type personal computer of this application example includes a body 121, a keyboard 122 used to input data, a display unit 123 displaying an image and the like wherein the display apparatus of the embodiment is used as the display unit 123.

Figure 9:
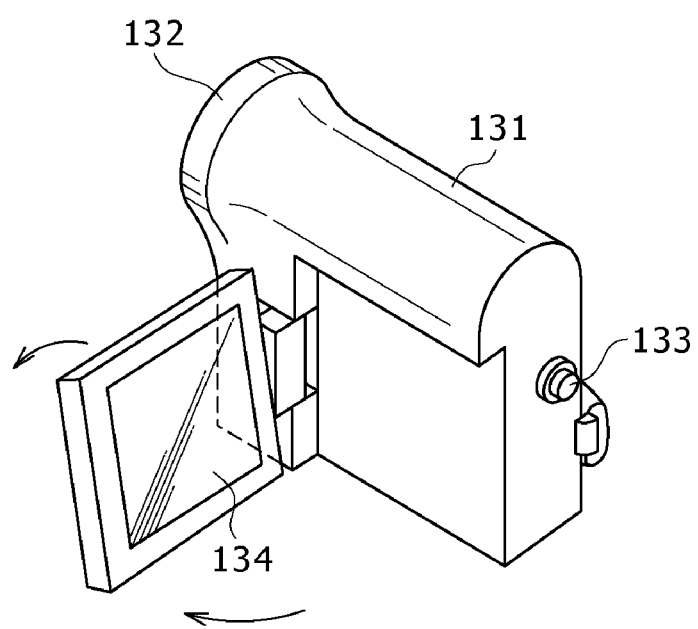
FIG. 9 is a schematic perspective view showing a video camera, to which the embodiment is applied.

FIG. 9 is a perspective view showing a video camera, to which the embodiment is applied. The video camera of this application example include a body 131, a lens system for photographing a subject provided at a forward side, a photographing start/stop switch 133, a display unit 134 and the like, wherein the display apparatus of the embodiment is used as the display unit 134.

FIGS. 10A to 10G are views showing a portable terminal apparatus, e.g. a cell phone, wherein FIG. 10A is a front view of a cell phone in an opened state, FIG. 10B is a side view of the cell phone, FIG. 10C is a front view in a closed state, FIG. 10D is a left side view in the closed state, FIG. 10E is a right side view in the closed state, FIG. 10 F is a top view and FIG. 10G is a bottom view. The cell phone of this application example includes an upper casing 141, a lower casing 142, a connection (a hinge in this case) 143, a display 144, a sub-display 145, a picture light 146, a camera 147 and the like, in which the display apparatus of the embodiment is used as the display 144 and the sub-display 145, respectively.

According to the method of the embodiment, as illustrated in FIG. 1C, when an energy beam is irradiated on a laminate of the metal oxide film 15 and the amorphous silicon film 19 through the light absorption layer 23, the amorphous silicon film 19 is crystallized by generation of heat of the light absorption layer 23 and, at the same time, the lower metal oxide film 15 is crystallized. In this way, there can be obtained the crystalline metal oxide film 15, without resorting to a thermal treatment, by application of the low temperature process for crystallizing the amorphous silicon film 19.

As a result, the metal oxide film 15, which is reduced in leak current and is high in specific permittivity, can be formed, as a gate insulating film 17a, on the substrate 1 such as a glass substrate or plastic substrate, which is low in cost although low in heat resistance. This enables a thin film transistor of great on current Id to be formed. This, in turn, makes it possible to improve a display performance of the display apparatus 5 on which the thin film transistor is provided.

When the on current Id becomes greater, the sizes of the transistor and retention capacitor can be reduced. Smaller sizes lead to a more reduced occupied area of in-plane patterns of the drive substrate, thereby resulting in an increasing gap area between patterns. Accordingly, the yield can be improved owing to a reduced possibility of causing short-circuiting with dust.

It will be noted that the materials and amounts thereof, and numerical conditions such as a treating time, sizes and the like illustrated in the foregoing embodiment are shown only as preferred. The dimensional shapes and positional relations used for illustration in the respective figures are roughly shown. In this sense, the embodiment should not be construed as limited to this embodiment.

For example, in the thin film transistor of this embodiment, the etching stop layer 25 is formed on the fine crystalline film 19a. The embodiment is applicable to a structure wherein the etching stop layer is formed, for example, through the fine silicon film (see Japanese Patent No. 2814319). In this way, many alterations to the structure after crystallization are possible.

In this embodiment, the fabrication of the bottom gate type thin film transistor Tr and the fabrication of the thin film transistor substrate 3 having the transistor Tr thereon are exemplified as a method of making a semiconductor device. In this connection, however, the thin film transistor may be of the top gate type. In this case, an amorphous silicon film and a metal oxide film converted into a gate insulating film are formed over the substrate 1 in this order, after which a light absorption layer is formed thereover and an energy beam is irradiated from the above to obtain a top gate type of thin film transistor. Where a metal film is used as the light absorption layer, the light absorption film may be employed as a gate electrode film after patterning. When an energy beam is irradiated after formation of such a gate electrode as mentioned above, the metal oxide film and amorphous silicon film are crystallized only at portions thereof below the gate electrode.

Furthermore, the embodiment is not limited to applications to the fabrication of the thin film transistor Tr and the thin film transistor substrate 3 having the transistor Tr thereon, but also widely to devices having a laminate of a semiconductor thin film and an insulating film.

In this embodiment, an organic EL display apparatus is exemplified as a display apparatus using a thin film transistor substrate. The display apparatus to which the embodiment is applied is not limited to an organic EL display apparatus, but is also applicable to flat panel displays such as a liquid crystal display apparatus provided that there are required the suppression of threshold variation an improvement in mobility and in-plane characteristic uniformity of a thin film transistor used as a drive device. In the latter case, similar results are obtained.

EXAMPLE

Figure 11A:
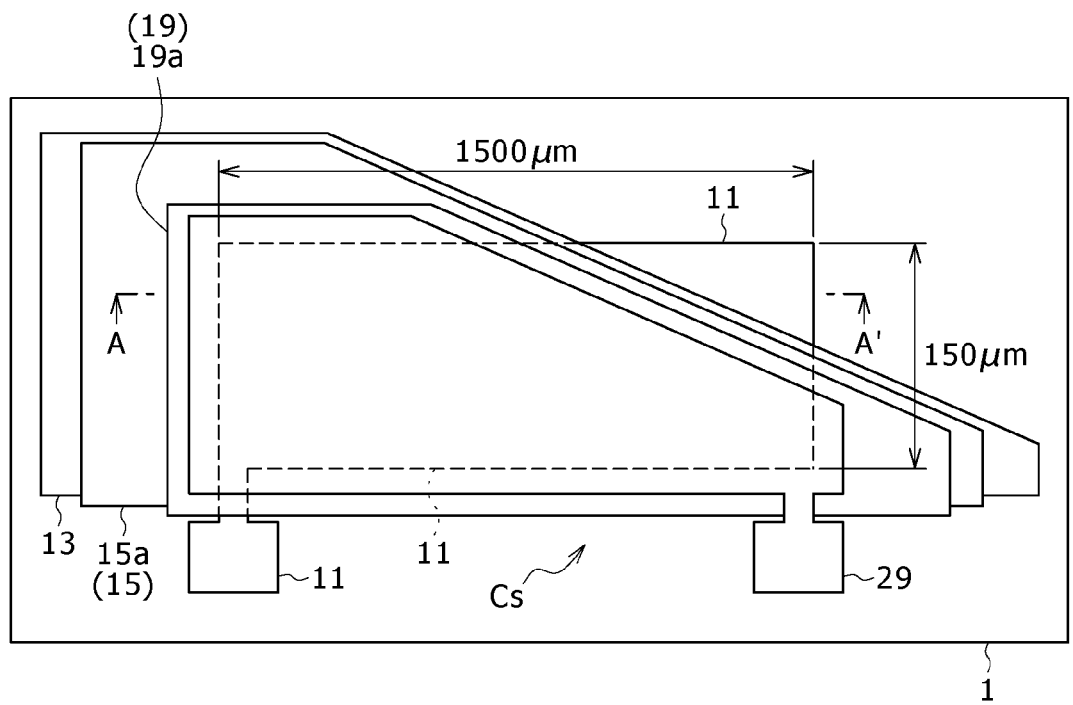
FIGS. 11A and 11B are, respectively, a plan view, partly cut away, of a capacitor device Cs made in example and a sectional view taken along line A-A' of FIG. 11A.
Figure 11B:
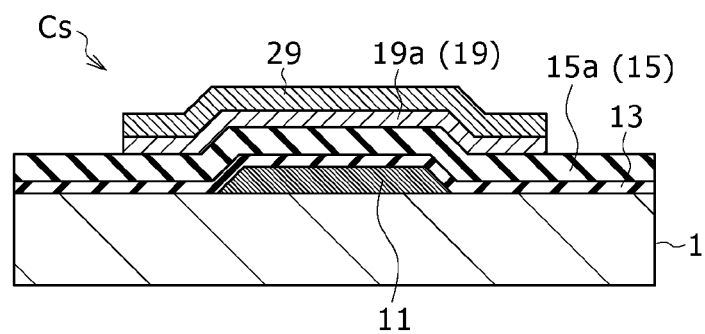

The method of the embodiment was applied so as to provide, as a semiconductor apparatus, a capacitor device made in the same procedure as the afore-indicated transistor Tr with the same layer structure. FIG. 11A is a plan view, partly cut away, of a capacitor device Cs made by the method and FIG. 11B is a sectional view, taken along A-A' of FIG. 11A. It will be noted that like reference symbols as in FIGS. 1A to 2D indicate like layers.

Initially, in order to form a capacitor device Cs having a size of 150 μm×1500 μm on an insulating substrate 1, a lower electrode 11 whose terminal was led out from a plan pattern was formed. Next, a silicon nitride film 13 (thickness 100 nm), an amorphous metal oxide film 15 (thickness 300 nm) made of titanium oxide ($TiO_x$) and an amorphous silicon film (thickness 30 nm) were laminated in this order.

Thereafter, a light absorption layer (thickness 200 nm) made of molybdenum (Mo) was formed through a buffer layer, not shown, (thickness 30 nm) made of silicon oxide.

Subsequently, a laser beam from a solid laser was scan-irradiated from above the light absorption layer to simultaneously crystallize the amorphous silicon film 19 and the metal oxide film 15, thereby providing a fine crystalline silicon film 19a and a crystalline metal oxide film 15a. After the crystallization, the buffer layer, amorphous silicon layer 19 and fine crystalline film 19a were removed by etching. The silicon nitride film 13 and the metal oxide film 15 were partly removed by etching in such a way that a terminal of the lower electrode was exposed.

Next, a laminated film of Al and Ti was patterned in such a shape that a terminal was led out from a 150 μm×1500 μm plan pattern as an upper electrode corresponding to a source electrode/drain electrode, thereby obtaining capacitor element Cs.

COMPARATIVE EXAMPLE

The procedure of the above example was repeated except that no crystallization with the laser beam was carried out, thereby obtaining a capacitor device.

<Evaluation and Results Thereof>

The capacitor devices Cs thus obtained in the example and comparative example were evaluated with respect to a capacitance between the upper electrode 29 of the same layer as the source electrode/drain electrode and the lower electrode 11 of the same layer as the gate electrode and a leak current.

The capacitance was measured under standard conditions of a frequency of 1 kHz and a voltage of 1V by use of an LCR meter 4284A. The leak current was measured as a current passing through the respective capacitor devices when applied with a voltage of 20 V. The results are shown in the following table.

TABLE

|  | Example | Comparative Example |
|---|---|---|
| Capacitance (pF) | 93 | 93 |
| Leak current (A) | 4.15E−10 | 1.28E−09 |

From the above table, the capacitor device of the example wherein crystallization with a laser beam is carried out and the capacitor device of the comparative example wherein no crystallization with a laser beam is carried out exhibit capacitance values equal to each other. However, the capacitor device of the example exhibits a leak current that is suppressed very low over the capacitor device of the comparative example.

In view of the foregoing, according to the method of the embodiment, an insulating film made of metal oxide can be crystallized by a low temperature process and thus it has been confirmed that there can be obtained, on a glass substrate or plastic substrate, an device having such good characteristics that a leak current is suppressed low.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor apparatus comprising:
a substrate;
a gate electrode formed on said substrate; and
a laminate structure formed on said substrate that includes an insulating film made of a metal oxide and a semiconductor thin film,
wherein,
said insulating film and said semiconductor thin film are both crystallized,
said insulating film is a gate insulating film, and
a portion of said gate insulating film is superposed over said gate electrode and has a crystallinity that is higher than that of other portions of said gate insulating film.

2. The semiconductor apparatus of claim 1, wherein said insulating film and said semiconductor thin film have at least fine crystallinity, respectively.

3. The semiconductor device of claim 1, wherein:
said gate insulating film is laminated with a silicon-based insulating film, and
said silicon-based insulating film, said insulating film made of the metal oxide, and said semiconductor thin film are laminated on said substrate in this order so as to cover said gate electrode formed on said substrate.

4. A display apparatus comprising:
a substrate;
a gate electrode formed on said substrate;
a thin film transistor and a pixel electrode connected thereto on said substrate; and
a laminate structure of (a) a gate insulating film having a metal oxide film and (b) a semiconductor thin film on said substrate,
wherein,
said gate insulating film and said semiconductor thin film are crystallized, respectively, and
a portion of said gate insulating film is superposed over said gate electrode and has a crystallinity that is higher than that of other portions of said gate insulating film.

5. The display device of claim 4, wherein said insulating film and said semiconductor thin film have at least fine crystallinity, respectively.

6. The display device of claim 4, wherein:
said gate insulating film is laminated with a silicon-based insulating film, and
said silicon-based insulating film, said insulating film made of the metal oxide, and said semiconductor thin film are laminated on said substrate in this order so as to cover said gate electrode formed on said substrate.

* * * * *